(12) United States Patent
Bae

(10) Patent No.: US 10,256,344 B2
(45) Date of Patent: Apr. 9, 2019

(54) OXIDE THIN FILM TRANSISTOR AND METHOD OF FABRICATING THE SAME

(71) Applicant: LG Display Co., Ltd., Seoul (KR)

(72) Inventor: JongUk Bae, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/906,498

(22) Filed: Feb. 27, 2018

(65) Prior Publication Data

US 2018/0204952 A1 Jul. 19, 2018

Related U.S. Application Data

(62) Division of application No. 14/026,769, filed on Sep. 13, 2013, now Pat. No. 9,941,410.

(30) Foreign Application Priority Data

May 14, 2013 (KR) .......................... 10-2013-0054551

(51) Int. Cl.
*H01L 29/786* (2006.01)
*H01L 29/66* (2006.01)

(52) U.S. Cl.
CPC .. *H01L 29/78636* (2013.01); *H01L 29/66969* (2013.01); *H01L 29/78606* (2013.01); *H01L 29/78693* (2013.01)

(58) Field of Classification Search
CPC ......... H01L 29/78636; H01L 29/78606; H01L 29/66969; H01L 29/78693;
(Continued)

(56) References Cited

U.S. PATENT DOCUMENTS

2004/0124480 A1* 7/2004 Park .................... H01L 27/1296
257/408
2006/0145190 A1 7/2006 Salzman et al.
(Continued)

FOREIGN PATENT DOCUMENTS

CN 1806322 A 7/2006
CN 101814529 A 8/2010
(Continued)

OTHER PUBLICATIONS

F.J. Morin; "Oxides Which Show a Metal-To-Insulator Transition at The Neel Temperature"; American Physical Society, Physical Review Letters, vol. 3, No. 1, pp. 34-36; Jul. 1, 1959.
(Continued)

*Primary Examiner* — William F Kraig
*Assistant Examiner* — Pavel G. Ivanov
(74) *Attorney, Agent, or Firm* — Dentons US LLP

(57) ABSTRACT

The present disclosure relates to an oxide thin film transistor and a fabricating method thereof. In the oxide thin film transistor, which uses amorphous zinc oxide (ZnO) semiconductor as an active layer, damage to the oxide semiconductor due to dry etching may be minimized by forming source and drain electrodes in a multilayered structure having at least two layers, and improving stability and reliability of a device by employing a dual passivation layer structure, which includes a lower layer for overcoming an oxygen deficiency and an upper layer to minimize effects of an external environment on the multilayered source and drain electrodes.

8 Claims, 13 Drawing Sheets

(58) Field of Classification Search
CPC ......... H01L 29/78666; H01L 29/78675; H01L 29/66757; G02F 2001/13685
See application file for complete search history.

(56) References Cited

U.S. PATENT DOCUMENTS

| | | |
|---|---|---|
| 2009/0186953 A1 | 7/2009 | Gesenhues et al. |
| 2010/0084649 A1 | 4/2010 | Seo et al. |
| 2010/0213460 A1 | 8/2010 | Kondo et al. |
| 2010/0308324 A1 | 12/2010 | Kim et al. |
| 2011/0114942 A1* | 5/2011 | Akimoto ............... H01L 29/45 257/43 |
| 2011/0263082 A1 | 10/2011 | Yamazaki et al. |
| 2011/0278565 A1 | 11/2011 | Yim et al. |
| 2011/0297930 A1 | 12/2011 | Choi et al. |
| 2012/0033505 A1 | 2/2012 | Sekine et al. |
| 2012/0242221 A1 | 9/2012 | Kim et al. |
| 2012/0315730 A1* | 12/2012 | Koezuka ........... H01L 29/78618 438/158 |
| 2013/0048977 A1 | 2/2013 | Watanabe et al. |
| 2013/0075735 A1 | 3/2013 | Watanabe et al. |
| 2013/0207104 A1 | 8/2013 | Lee |

FOREIGN PATENT DOCUMENTS

| | | |
|---|---|---|
| CN | 103000694 A | 3/2013 |
| JP | 2005-175023 A | 6/2005 |
| JP | 2010219506 A | 9/2010 |
| JP | 2010-283326 A | 12/2010 |
| JP | 2011-222767 A | 11/2011 |
| JP | 2013-30785 A | 2/2013 |
| JP | 2013065843 A | 4/2013 |
| JP | 2013084941 A | 5/2013 |
| WO | 2011/111781 A1 | 9/2011 |
| WO | 2012/063614 A1 | 5/2012 |

OTHER PUBLICATIONS

Balachandran, et al.; "Electrical Conductivity in Non-Stoichiometric Titanium Dioxide at Elevated Temperatures"; Springer International Publishing AG., Journal of Material Science 23; 2676-2682; 1988.

Dobrovinskaya, et al.; "Sapphire Material, Manufacturing Applications"; Springer Science+Business Media; pp. 55-58; 2009.

* cited by examiner

OXIDE THIN FILM TRANSISTOR AND METHOD OF FABRICATING THE SAME

CROSS-REFERENCE TO RELATED APPLICATIONS

This application is a Divisional of application Ser. No. 14/026,769, filed Sep. 13, 2013, now allowed, which claims priority to and the benefit of Korean Patent Application No. 10-2013-0054551 filed on May 14, 2013, all of which are incorporated by reference in their entirety for all purposes as if fully set forth herein.

BACKGROUND OF THE INVENTION

Field of the Invention

The present disclosure relates to an oxide thin film transistor (TFT) and a fabrication method thereof. More particularly, the present invention relates to an oxide TFT having an amorphous zinc oxide semiconductor as an active layer, and a fabrication method thereof.

Discussion of the Related Art

As the consumers' interest in information displays is growing and the demand for portable (mobile) information devices is increasing, research and commercialization of light and thin flat panel displays (FPD), which substitute cathode ray tubes (CRTs), the conventional display devices, have increased. Among FPDs, the liquid crystal display (LCD) is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

A related art LCD will now be described in detail with reference to FIG. 1.

FIG. 1 is an exploded perspective view showing a structure of the related art LCD device.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective intersections of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

The foregoing LCD is light and has low power consumption, as such, the LCD receives much attention, but the LCD is a light receiving device, not a light emission device, having a technical limitation in brightness, a contrast ratio, a viewing angle, and the like. Thus, a new display device that can overcome such shortcomings is being actively developed.

An organic light emitting diode (OLED), one of new flat panel display devices, is self-emissive, having a good viewing angle and contrast ratio compared with the LCD, and because it does not require a backlight, it can be formed to be lighter and thinner. Also, the OLED is advantageous in terms of power consumption. Besides, the OLED can be driven with a low DC voltage and has a fast response speed, and in particular, the OLED is advantageous in terms of a fabrication cost.

Recently, research for an increase of a size of an OLED display device is actively ongoing, and in order to achieve such a large-scale OLED display device, development of a transistor that can secure constant current characteristics as a driving transistor of an OLED to ensure a stable operation and durability is required.

An amorphous silicon thin film transistor (TFT) used for the above-described LCD may be fabricated in a low temperature process, but has a very low mobility and fails to satisfy a constant current bias condition. Meanwhile, a polycrystalline silicon TFT has a high mobility and satisfying constant current bias condition but fails to secure uniform characteristics, making it difficult to have a large area and requiring a high temperature process.

Thus, an oxide TFT including an active layer formed with oxide semiconductor is being developed. Here, when the oxide semiconductor is applied to a conventional bottom gate type TFT, the oxide semiconductor is damaged during etching of source and drain electrodes. This may denature the oxide semiconductor.

FIG. 2 is a sectional view schematically showing a structure of a related art oxide thin film transistor (TFT).

As shown in FIG. 2, a related art oxide TFT includes a gate electrode 21 and a gate insulating layer 15 formed on a substrate 10, and an active layer 24 formed on the gate insulating layer 15 and made of an oxide semiconductor material.

Afterwards, source and drain electrodes 22 and 23 are formed on the active layer 24. Here, while the source and drain electrodes 22 and 23 are deposited and etched, the lower active layer 24 (especially, a back channel region of a part A) may be damaged to be denatured. This may cause a problem in reliability of a device.

That is, since the active layer made of the oxide semiconductor material does not have selectivity with respect to wet etching during etching of the source and drain electrodes, dry etching is generally used. Recently, wet etching with improved selectivity is being attempted but deterioration of device characteristics is caused due to partial etching, which results from low uniformity.

Upon using the wet etching, a loss or damage of the active layer is caused due to a property of the oxide semiconductor, which is vulnerable to an etchant. Even when the source and drain electrodes are formed using the dry etching, the active layer is denatured due to back-sputtering and oxygen deficiency of the oxide semiconductor.

Specifically, when molybdenum (Mo) based metals are applied to form the source and drain electrodes in consideration of contact resistance with the oxide semiconductor, it is difficult to develop an etchant with selectivity with respect to the oxide semiconductor which is vulnerable to acidity.

As such, due to environmental sensitivity of the oxide semiconductor and drastic deterioration of the oxide semiconductor by post-processes upon being exposed, an etch stopper structure has to be applied. This may, however, increase the number of processes and masks, causing a decrease of mass production.

SUMMARY OF THE INVENTION

An object of the present disclosure is to provide an oxide thin film transistor (TFT) using an amorphous zinc oxide semiconductor as an active layer and a fabrication method thereof.

Another object of the present disclosure is to an oxide TFT, capable of preventing damage to an active layer, which may be caused when patterning source and drain electrodes, without an additional process, and improving stability and reliability of a device by applying a dual (double) passivation layer structure, and a fabricating method thereof.

Additional features and advantages of embodiments of the disclosure will be set forth in the description which follows, and in part will be apparent from the description, or may be learned by practice of embodiments of the disclosure. These objectives and other advantages of the embodiments of the disclosure will be realized and attained by the structure particularly pointed out in the written description and claims thereof as well as the appended drawings.

To achieve the above objects and advantages, the present invention employs a thin film transistor, comprising: a gate electrode made of a first conductive film; a gate insulating layer formed on the gate electrode; an active layer formed on the gate insulating layer, the active layer made of an oxide semiconductor having zinc based oxide; source and drain electrodes formed on the active layer; a lower passivation layer formed on the source and drain electrodes and on the active layer disposed between the source and drain electrodes, the lower passivation layer made of an insulating layer including oxide; and an upper passivation layer formed on the lower passivation layer, the upper passivation layer made of an insulating layer having higher density than the lower passivation layer.

Further, the present invention may employ a thin film transistor, comprising: an active layer made of an oxide semiconductor having zinc based oxide; source and drain electrodes formed on the active layer; a gate insulating layer formed on the active layer disposed between the source and drain electrodes; a gate electrode which is made of a first conductive film and is formed on the gate insulating layer; a lower passivation layer formed on the source and drain electrodes and on the active layer disposed between the source and drain electrodes, the lower passivation layer made of an insulating layer including oxide; and an upper passivation layer formed on the lower passivation layer, the upper passivation layer made of an insulating layer having higher density than the lower passivation layer.

The oxide thin film transistor and the fabricating method thereof according to one exemplary embodiment ensures stable and excellent device characteristics because the oxide semiconductor is not damaged during patterning of source and drain electrodes.

The oxide thin film transistor and a fabricating method thereof according to one exemplary embodiment minimizes contact resistance by appropriately selecting a lower layer by virtue of the use of dual-layered source and drain electrodes, and simplify processes by oxidizing Ti into TiO when the Ti is used to form the lower layer of the source and drain electrodes and using the oxidized TiO as an in-situ protection layer.

The oxide thin film transistor and a fabricating method thereof according to one exemplary embodiment provides an improved stability and reliability of a device by forming a dual passivation layer structure, including a lower layer for overcoming a deficiency and an upper layer for minimizing external affection, on the dual-layered source and drain electrodes.

The oxide thin film transistor and a fabricating method thereof according to one exemplary embodiment provides an improved device performance by simplifying processes and reducing device size, by virtue of excluding a masking process for patterning an etch stopper.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

FIGS. 8E' to 8G' are sectional views sequentially showing a fabrication process of an oxide TFT according to another exemplary embodiment of the present disclosure.

DETAILED DESCRIPTION OF THE ILLUSTRATED EMBODIMENTS

Figure 1:
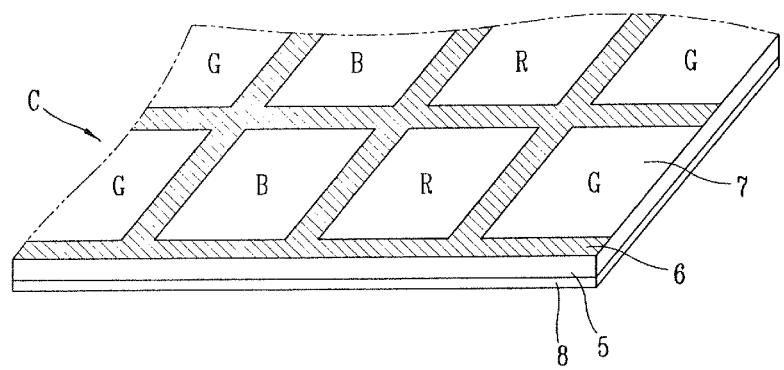
FIG. 1 is an exploded perspective view showing a related art liquid crystal display (LCD) device.
Figure 1:
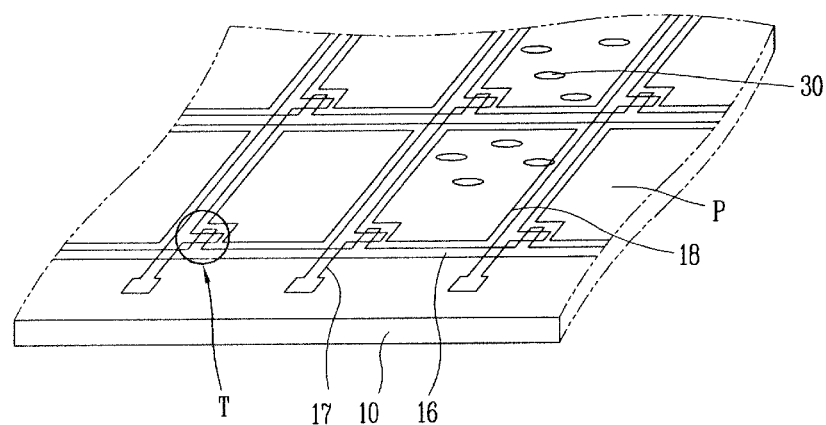
Figure 2:
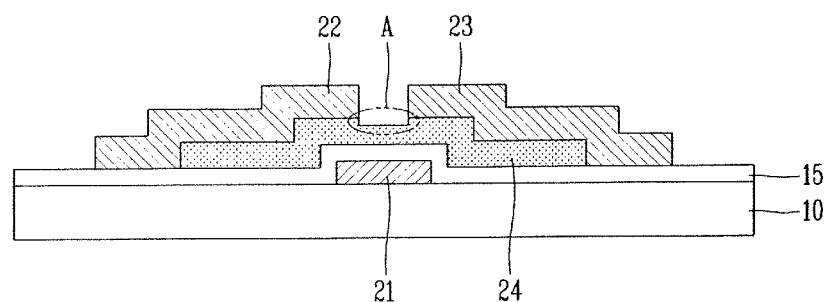
FIG. 2 is a sectional view showing the structure of a related art oxide thin film transistor (TFT)

An oxide thin film transistor (TFT) and its fabrication method according to exemplary embodiments of the present disclosure will now be described with reference to the accompanying drawings, such that those skilled in the art to which the present disclosure belongs can easily practice it.

Advantages and features of the present disclosure and methods for achieving those will be obviously understood by the following exemplary embodiments described in detail with reference to the accompanying drawings. However, the present disclosure is not to be construed as being limited to the exemplary embodiments but can be implemented into various forms. The exemplary embodiments of the present disclosure are merely illustrated to fully describe the present disclosure and provided to help a skilled person in the art to understand the scope of the present disclosure. The present disclosure is merely defined by the claims. The same/like reference symbols or numerals over the specification refer to the same/like components. Sizes of layers and regions and relative sizes in the drawings are exaggerated for clear understanding of the description.

The term "an element or layer located/formed on another element or layer" may indicate not only an element or layer located on another element or layer but also the element or layer located on the another element or layer with interposing another layer or element therebetween. On the other hand, the term "an element or layer located directly on" refers to not interposing another element or layer therebetween.

Spatially relative terms "below or beneath," "lower," "above," "upper" and the like, as shown in the drawings, may be used for easily describing relationship between one element or components and another element or components. The spatially relative terms should be construed as terms including different directions of elements during use or operation, in addition to directions shown in the drawings. For example, if an element shown in the drawing is turned over, an element which is described as "blow" or "beneath" of another element may be located "above" the another element. Therefore, the illustrative term "below" or "beneath" will cover both "below" and "above."

Terms used herein are merely illustrative and not to be construed as limiting the present disclosure. The expression in the singular form in this specification will cover the expression in the plural form unless otherwise indicated obviously from the context. Terms "comprising," "including," and/or "having" used herein should be understood that they are intended to indicate an existence or addition of several components or several steps, several operations and/or elements disclosed in the specification.

Figure 3:
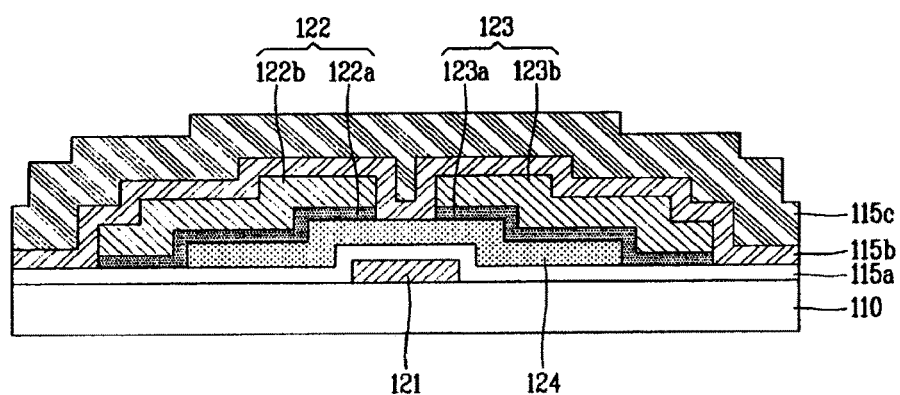
FIG. 3 is a sectional view showing the structure of an oxide TFT according to a first exemplary embodiment of the present disclosure.

FIG. 3 is a sectional view schematically showing a structure of an oxide TFT according to a first exemplary embodiment of the present disclosure. This exemplarily illustrates a structure of an oxide TFT which uses an amorphous zinc oxide semiconductor as an active layer.

As shown in FIG. 3, the oxide TFT according to the first exemplary embodiment of the present disclosure may include a gate electrode 121 formed on a predetermined substrate 110, a gate insulating layer 115a formed on the gate electrode 121, an active layer 124 made of an amorphous zinc oxide semiconductor and formed on the gate insulating layer 115a, and source and drain electrodes 122 and 123 electrically connected with predetermined regions of the active layer 124.

Here, the oxide TFT according to the first exemplary embodiment may have the source and drain electrodes 122 and 123 with a double-layered structure. This may prevent damage to the amorphous zinc oxide semiconductor, namely, the active layer 124, which may be caused during patterning of the source and drain electrodes 122 and 123, and to minimize contact resistance between the active layer 124 and the source and drain electrodes 122 and 123.

That is, the source and drain electrodes 122 and 123 according to the first exemplary embodiment may include second source and drain electrodes 122b and 123b formed on an upper layer and made of a metal, such as copper (Cu), aurum (Au), molybdenum (Mo) or the like, each having low resistivity, irrespective of contact resistance with respect to the amorphous zinc oxide semiconductor, and first source and drain electrodes 122a and 123a formed on a lower layer coming in contact with the active layer 124 and made of a metal, such as titanium (Ti), titanium (Ti) alloy such as molybdenum titanium (MoTi), molybdenum (Mo) or the like, each having selectivity with respect to the second source and drain electrodes 122b and 123b during wet etching and low contact resistance with respect to the amorphous zinc oxide semiconductor.

Here, damage to the active layer 124, which may be caused during dry etching of the first source and drain electrodes 122a and 123a, may be minimized by minimizing a thickness of a metal required to be processed by dry etching.

Here, in the oxide TFT according to the first exemplary embodiment of the present disclosure, for example, the active layer may be formed by using amorphous zinc oxide (ZnO) semiconductor to satisfy high mobility and constant current test conditions and secure uniform characteristics, having an advantage of being applicable to a large-scale display.

The zinc oxide (ZnO) is a material which can implement three properties of conductivity, semiconductor characteristics, and resistivity according to the oxygen content, so the oxide TFT employing the amorphous zinc oxide semiconductor material as the active layer may be applicable to a large-scale display including an LCD device and an OLED device.

Also, recently, huge interest and activity are concentrated on a transparent electronic circuit, and in this case, since the oxide TFT employing the amorphous zinc oxide semiconductor material as an active layer has high mobility and can be fabricated at a low temperature, it can be used for the transparent electronic circuit.

In particular, in the oxide TFT according to the first exemplary embodiment of the present disclosure, the active layer may be formed by using a-IGZO semiconductor obtained by containing heavy metals such as indium (In), gallium (Ga), or the like, in ZnO.

The a-IGZO semiconductor, allowing visible ray to be transmitted therethrough, is transparent, and the oxide TFT fabricated by using the a-IGZO semiconductor has mobility of 1 to 100 $cm^2$/Vs, exhibiting high mobility compared with an amorphous silicon TFT.

Also, since the a-IGZO semiconductor has a wide band gap, it may be used for fabricating a UV light emitting diode (LED) having high color purity, a white LED, and other components, and also, since the a-IGZO semiconductor is processed at a low temperature, it can be used to produce a light, flexible product.

In addition, since the oxide TFT fabricated by using a-IGZO semiconductor exhibits uniform characteristics similar to those of the amorphous silicon TFT, it may advantageously have a simple component structure like the amorphous silicon thin film transistor and be applicable to a large-scale display.

In the oxide TFT according to the first exemplary embodiment having the characteristics, a carrier concentration of the active layer 124 may be adjusted by controlling a concentration of oxygen within reaction gas during sputtering. This may allow for adjustment of device characteristics of the TFT. As one example, the active layer 124 may be formed using the a-IGZO semiconductor, which is deposited under a condition of 1 to 10% of oxygen concentration.

As the aforementioned oxide TFT according to the first exemplary embodiment has the source and drain electrodes 122 and 123 formed in a multilayered structure more than two layers, a material with low resistivity may be selected as an upper layer metal, irrespective of contact resistance with the a-IGZO semiconductor, and the lower layer may be formed thin. This may result in minimization of damages to the oxide semiconductor due to dry etching.

Here, even if the source and drain electrodes 122 and 123 are formed in the multilayered structure, the damage to the oxide semiconductor may not be fully prevented. There may still remain possibility of causing a deficiency due to damage to a part of the active layer 124.

Therefore, in the oxide TFT according to the first exemplary embodiment, defective regions may be stabilized through surface treatment and also defective layers may be stabilized using an upper passivation layer. To overcome or restore the defective regions, dual (two) passivation layers may be formed. A lower passivation layer 115b may be deposited to overcome an oxygen deficiency and an upper passivation layer 115c may be deposited to minimize effects of an external environment.

That is, the lower passivation layer 115b may be formed of an insulating film, which contains oxygen (preferably, equal or larger than 1E+20 atoms/$cm^3$) and a small quantity of hydrogen (preferably, equal or smaller than 1E+20 atoms/$cm^3$), for curing a back channel region which suffers from oxygen deficiency due to dry etching when patterning the first source and drain electrodes 122a and 123a. As one example, the lower passivation layer 115b may include MOx, such as TiOx, TaOx, AlOx or the like, or SiOx. Here, to form a porous insulating layer, a deposition temperature may preferably be below 250° C. For example, the lower passivation layer 115b may be deposited with a thickness of 10 Å to 100 Å at temperature of 100° C. to 250° C. After deposition of the lower passivation layer 115b under the conditions, thermal treatment may further be carried out at temperature of 200° C. to 300° C.

The upper passivation layer 115c may be a layer for completely blocking the TFT from external environments, and implemented as a high density layer containing $SiO_2$.

Hereinafter, description will be given in detail of a method for fabricating the oxide TFT according to the first exemplary embodiment having the configuration, with reference to the accompanying drawings.

FIGS. 4A to 4F are sectional views sequentially showing a fabrication process of the oxide TFT illustrated according to the first exemplary embodiment of the present disclosure in FIG. 3.

Figure 4A:
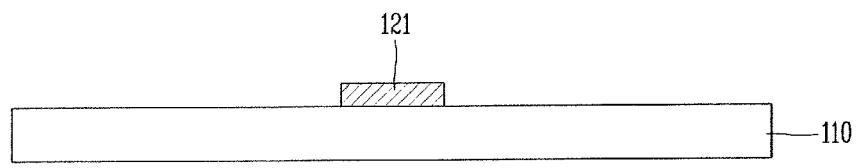
FIGS. 4A to 4F are sectional views sequentially showing a fabrication process of the oxide TFT illustrated according to the first exemplary embodiment of the present disclosure in FIG. 3.

As shown in FIG. 4A, a predetermined gate electrode 121 may be formed on a substrate 110 made of a transparent insulating material.

In this case, amorphous zinc oxide composite semiconductor applied to the oxide TFT may be deposited at a low temperature, so the substrate 110, such as a plastic substrate, soda-line glass, or the like, which may be applicable to a low temperature process, may be used. Also, since the oxide semiconductor exhibits amorphous characteristics, it may be used for a substrate employed in a large-scale display device.

The gate electrode 121 may be formed by depositing a first conductive film on an entire surface of the substrate 110 and selectively patterning the first conductive film through a photolithography process (a first masking process).

Here, the first conductive film may be made of a low-resistivity obscure conductive material such as aluminum (Al), Al alloy, tungsten (W), copper (Cu), nickel (Ni), chromium (Cr), molybdenum (Mo), titanium (Ti), platinum (Pt), tantalum (Ta), and the like. Also, the first conductive film may be made of a transparent conductive material such as indium-tin-oxide (ITO), indium-zinc-oxide (IZO), or the like. Also, the first conductive film may have a multilayered structure by stacking two or more conductive materials.

Figure 4B:
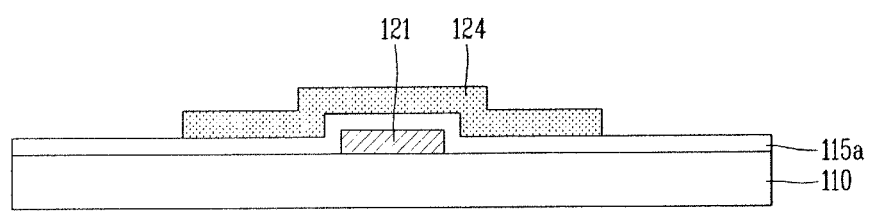

Next, as shown in FIG. 4B, a gate insulating layer 115a formed of an inorganic insulating layer such as a silicon nitride film (SiNx), a silicon oxide film ($SiO_2$), or the like, or a high dielectric oxide film such as hafnium (Hf) oxide or aluminum oxide, may be formed on the entire surface of the substrate 110 with the gate electrode 121 formed thereon.

The gate insulating layer 115a may be formed by chemical vapor deposition (CVD) or plasma enhanced chemical vapor deposition (PECVD).

An amorphous zinc oxide semiconductor layer made of an amorphous zinc oxide semiconductor may be formed on the entire surface of the substrate 110 with the gate insulating layer 115a formed thereon and then patterned through a photolithography process (a second masking process) to form an active layer 124 made of the amorphous zinc oxide semiconductor at an upper side of the gate electrode 121.

Here, the amorphous zinc oxide composite semiconductor, especially, the a-IGZO semiconductor may be formed by sputtering a composite target such as gallium oxide ($Ga_2O_3$), indium oxide ($In_2O_3$) and zinc oxide (ZnO). In addition, a chemical deposition such as the CVD or atomic layer deposition (ALD) may be available. Here, the present disclosure may not be limited to the a-IGZO semiconductor. The active layer 124 may be made of an oxide semiconductor such as MaMbMcOd (Ma, Mb, Mc: metal)

Also, the a-IGZO semiconductor may form an amorphous zinc oxide semiconductor layer using composite oxide targets, which contain gallium, indium and zinc in atomic ratios of 1:1:1, 2:2:1, 3:2:1, 4:2:1 and the like, respectively.

The oxide TFT according to the first exemplary embodiment may be allowed to adjust a carrier concentration of the active layer 124 by controlling a concentration of oxygen within reaction gas during sputtering for forming the amorphous zinc oxide semiconductor layer. Here, uniform device characteristics may be secured under a condition of 1 to 10% of oxygen concentration.

Figure 4C:
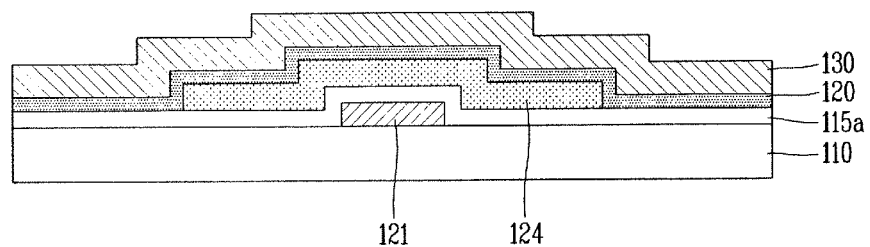

As shown in FIG. 4C, a second conductive film 120 and a third conductive film 130 may be formed sequentially on an entire surface of the substrate 110 having the active layer 124 thereon.

The second conductive film 120 may be made of a metal, such as titanium, titanium alloy such as molybdenum titanium, molybdenum, or the like, which has selectivity with respect to the upper second source and drain electrodes upon wet etching for forming the lower first source and drain electrodes, and low contact resistance with respect to the amorphous zinc oxide semiconductor. The second conductive film 120 may also have a multilayered structure that at least one another conductive material is stacked on a metal, such as the titanium, molybdenum titanium, molybdenum or the like.

Here, the second conductive film 120 according to the first exemplary embodiment may have a thickness approximately in the range of 50 to 200 Å, while having a thickness approximately in the range of 50 to 300 Å upon using dry etching. Accordingly, the damage to the oxide semiconductor due to the dry etching may be minimized.

Also, since the third conductive film 130 forms the upper second source and drain electrodes, the third conductive film 130 may be made of a metal, such as copper (Cu), aurum (Au), molybdenum (Mo) and the like, each of which has low resistivity, irrespective of contact resistance with the amorphous zinc oxide semiconductor.

Here, prior to depositing the second conductive film 120 on the substrate 110 having the active layer 124 formed thereon, a predetermined surface treatment, such as oxygen plasma treatment, may be carried out. This is to supply extra oxygen to a surface of the amorphous zinc oxide semiconductor because of strong oxidative property of the titanium when the titanium is selected as the second conductive film 120.

Figure 4D:
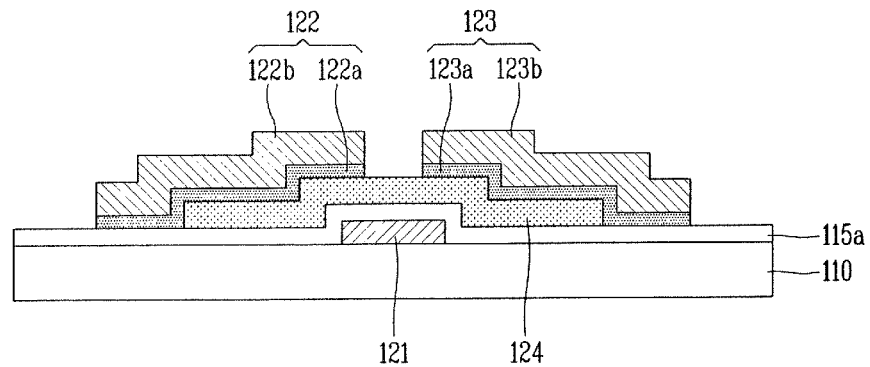

As shown in FIG. 4D, the third conductive layer 130 may be selectively patterned through a photolithography process (a third masking process), thereby forming second source and drain electrodes 122b and 123b, which are formed of the third conductive film 130, on the second conductive film 120.

Here, etching of the third conductive film 130 may be wet etching which is appropriate for large scale and uniformity.

By selectively patterning the lower second conductive film 120, first source and drain electrodes 122a and 123a, which are formed of the second conductive film 120, may be formed. Here, etching of the second conductive film 120 may be dry etching. As aforementioned, since the second conductive film 120 is formed thin approximately in the range of 50 to 300 Å, damage to the oxide semiconductor due to the dry etching may be minimized.

Figure 4E:
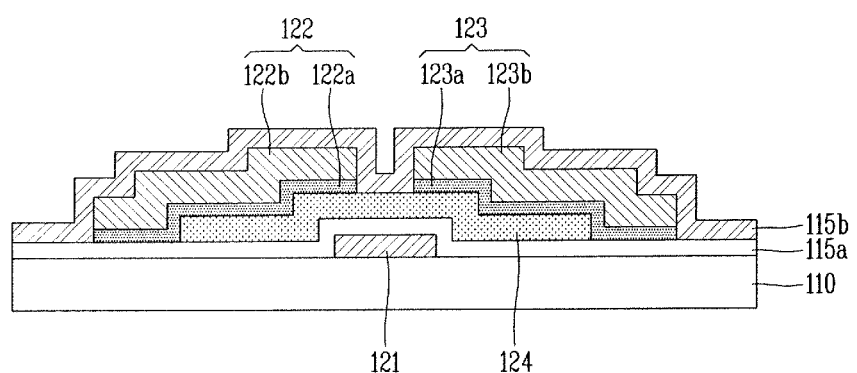

As shown in FIG. 4E, on the entire surface of the substrate 110 having the source and drain electrodes 122 and 123 formed thereon may be formed a lower passivation layer 115b for curing damage to a back channel of the active layer 124, caused due to the dry etching of the second conductive film 120.

That is, as aforementioned, the lower passivation layer 115b may be formed of an insulating film, which contains oxygen (preferably, equal or larger than $1E+20$ atoms/cm$^3$) and a small quantity of hydrogen (preferably, equal or smaller than $1E+20$ atoms/cm$^3$), for curing the back channel region which suffers from the oxygen deficiency due to the dry etching when patterning the first source and drain electrodes 122a and 123a. As one example, the insulating film may include MOx (M: metal), such as TiOx, TaOx, AlOx and the like, or SiOx.

Here, to form a porous insulating layer, a deposition temperature may preferably be below 250° C. As one example, the lower passivation layer 115b may be formed with a thickness of 10 Å to 100 Å at temperature of 100° C. to 250° C. After depositing the lower passivation layer 115b under the conditions, thermal treatment may further be carried out for the lower passivation layer 115b at temperature of 200° C. to 300° C.

Figure 4F:
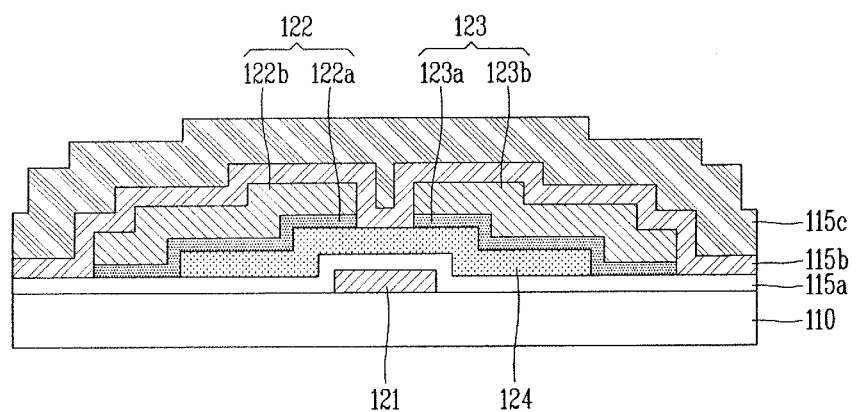

As shown in FIG. 4F, an upper passivation layer 115c may be formed on the entire surface of the substrate 110 having the lower passivation layer 115b thereon, so as to completely block the TFT from external environments.

Here, the upper passivation layer 115c may be formed of a high density film containing $SiO_2$.

As such, the oxide TFT according to the first exemplary embodiment may have passivation layers 115b and 115c in the double-layered structure, so as to overcome or restore defective regions.

In the meantime, when the lower layer of the source and drain electrodes is formed of Ti, it may be oxidized into TiO to be used as an in-situ protection layer. This may have advantages in terms of simplified processes and minimized contact resistance. This will be described in detail in accordance with a second exemplary embodiment of the present disclosure.

Figure 5:
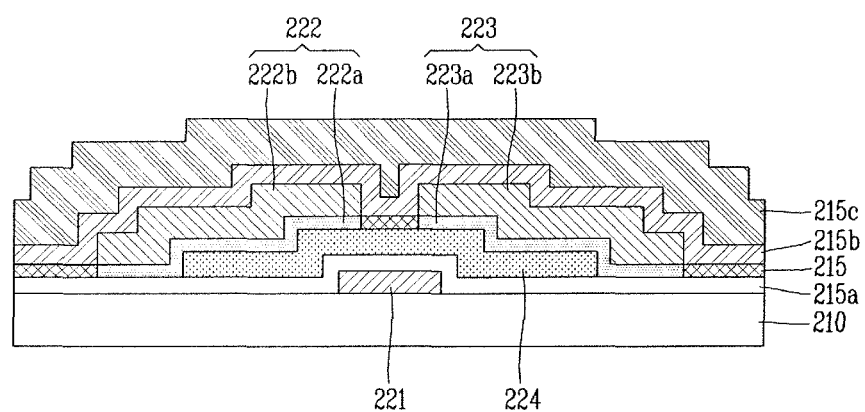
FIG. 5 is a sectional view showing the structure of an oxide TFT according to a second exemplary embodiment of the present disclosure.

FIG. 5 is a sectional view schematically showing a structure of an oxide TFT according to a second exemplary embodiment of the present disclosure. An oxide TFT according to a second exemplary embodiment may include the same components as the oxide TFT according to the first exemplary embodiment, excluding that a lower layer of source and drain electrodes is formed of Ti and oxidized into TiO to be used as an in-situ protection layer.

As shown in FIG. 5, the oxide TFT according to the second exemplary embodiment of the present disclosure may include a gate electrode 221 formed on a predetermined substrate 210, a gate insulating layer 215a formed on the gate electrode 221, an active layer 224 made of an amorphous zinc oxide semiconductor and formed on the gate insulating layer 215a, and source and drain electrodes 222 and 223 electrically connected with predetermined regions of the active layer 224.

Here, in the oxide TFT according to the second exemplary embodiment of the present disclosure, the active layer may be formed by using amorphous zinc oxide (ZnO) semiconductor, as the same as the oxide TFT according to the first exemplary embodiment, to satisfy high mobility and constant current test conditions and secure uniform characteristics, having an advantage of being applicable to a large-scale display.

In the oxide TFT according to the second exemplary embodiment of the present disclosure, the active layer 224 may be formed by using a-IGZO semiconductor obtained by containing heavy metals such as indium (In), gallium (Ga), or the like, in ZnO.

In the oxide TFT according to the second exemplary embodiment having the characteristics, a carrier concentration of the active layer 224 may be adjusted by controlling a concentration of oxygen within reaction gas during sputtering. This may allow for adjustment of device characteristics of the TFT. As one example, the active layer 224 may be formed using the a-IGZO semiconductor, which is deposited under a condition of 1 to 10% of oxygen concentration.

Here, the oxide TFT according to the first exemplary embodiment may include the source and drain electrodes 222 and 223, which are formed to have a double-layered structure, to prevent damage to the amorphous zinc oxide semiconductor, namely, the active layer 224, which may be caused during patterning of the source and drain electrodes 222 and 223, and minimize contact resistance between the active layer 224 and the source and drain electrodes 222 and 223.

That is, the source and drain electrodes 222 and 223 according to the second exemplary embodiment, as same as in the first exemplary embodiment, may include second source and drain electrodes 222b and 223b formed on an upper layer and made of a metal, such as copper (Cu), aurum (Au), molybdenum (Mo) or the like, each having low resistivity, irrespective of contact resistance with respect to the amorphous zinc oxide semiconductor, and first source and drain electrodes 122a and 123a formed on a lower layer coming in contact with the active layer 124 and made of a metal, such as titanium (Ti), titanium (Ti) alloy such as molybdenum titanium (MoTi), molybdenum (Mo) or the like, each having selectivity with respect to the second source and drain electrodes 222b and 223b during wet etching and low contact resistance with respect to the amorphous zinc oxide semiconductor.

Since the aforementioned oxide TFT according to the second exemplary embodiment includes the source and drain electrodes 222 and 223 formed in the multilayered structure more than two layers, a material with low resistivity may be selected as an upper layer metal, irrespective of contact resistance with the a-IGZO semiconductor. When the lower layer of the source and drain electrodes 222 and 223 is formed of Ti, the Ti may be oxidized into TiO to be used as an in-situ protection layer 215.

To overcome or restore the defective regions, dual (two) passivation layers may be deposited. A lower passivation layer 215b may be deposited to overcome an oxygen deficiency and an upper passivation layer 215c may be deposited to minimize effects from an external environment.

That is, the lower passivation layer 215b may be formed of an insulating film, which contains oxygen (preferably, equal or larger than 1E+20 atoms/cm$^3$) and a small quantity of hydrogen (preferably, equal or smaller than 1E+20 atoms/cm$^3$), for curing a back channel region which suffers from oxygen deficiency. As one example, the lower passivation layer 215b may include MOx, such as TiOx, TaOx, AlOx or the like, or SiOx. Here, to form a porous insulating layer, a deposition temperature may preferably be below 250° C. For example, the lower passivation layer 215b may be deposited with a thickness of 10 Å to 100 Å at temperature of 100° C. to 250° C. After deposition of the lower passivation layer 215b under the conditions, thermal treatment may further be carried out at temperature of 200° C. to 300° C.

The upper passivation layer 215c may be a layer for completely blocking the TFT from external environments, and implemented as a high density layer containing SiO$_2$.

Hereinafter, description will be given in detail of a method for fabricating the oxide TFT according to the second exemplary embodiment having the configuration, with reference to the accompanying drawings.

FIGS. 6A to 6G are sectional views sequentially showing a fabrication process of the oxide TFT illustrated according to the second exemplary embodiment of the present disclosure in FIG. 5

Figure 6A:
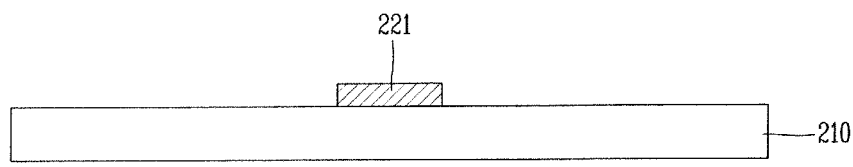
FIGS. 6A to 6G are sectional views sequentially showing a fabrication process of the oxide TFT illustrated according to the second exemplary embodiment of the present disclosure in FIG. 5.

As shown in FIG. 6A, a predetermined gate electrode 221 may be formed on a substrate 210 made of a transparent insulating material.

In this case, amorphous zinc oxide composite semiconductor applied to the oxide TFT may be deposited at a low temperature, so the substrate 110, such as a plastic substrate, soda-line glass, or the like, which may be applicable to a low temperature process, may be used. Also, since the composite semiconductor exhibits amorphous characteristics, it may be used for the substrate 210 employed in a large-scale display device.

The gate electrode 221 may be formed by depositing a first conductive film on an entire surface of the substrate 210 and selectively patterning the first conductive film through a photolithography process (a first masking process).

Here, the first conductive film may be made of a low-resistivity obscure conductive material such as aluminum (Al), Al alloy, tungsten (W), copper (Cu), nickel (Ni), chromium (Cr), molybdenum (Mo), titanium (Ti), platinum (Pt), tantalum (Ta), and the like. Also, the first conductive film may be made of a transparent conductive material such as indium-tin-oxide (ITO), indium-zinc-oxide (IZO), or the like. The first conductive film may also have a multilayered structure by stacking two or more conductive materials.

Figure 6B:
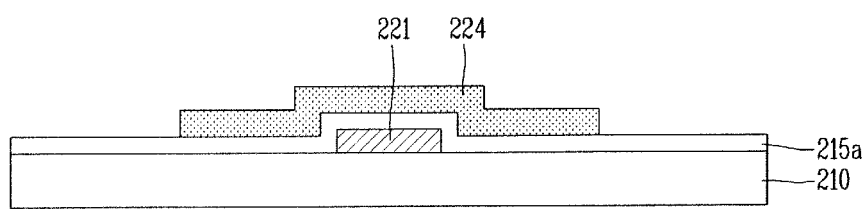

Next, as shown in FIG. 6B, the gate insulating layer 215a formed of an inorganic insulating layer such as a silicon nitride film (SiNx), a silicon oxide film (SiO$_2$), or the like, or a high dielectric oxide film such as hafnium (Hf) oxide or aluminum oxide, may be formed on the entire surface of the substrate 210 with the gate electrode 221 formed thereon.

An amorphous zinc oxide semiconductor layer may be formed on the entire surface of the substrate 210 with the gate insulating layer 215a formed thereon and then selectively patterned through a photolithography process (a second masking process) to form an active layer 224 made of the amorphous zinc oxide semiconductor at an upper side of the gate electrode 221.

Here, the amorphous zinc oxide composite semiconductor, especially, the a-IGZO semiconductor may be formed by sputtering a composite target such as gallium oxide (Ga$_2$O$_3$), indium oxide (In$_2$O$_3$) and zinc oxide (ZnO). In addition, a chemical deposition such as the CVD or atomic layer deposition (ALD) may be available. Here, the present disclosure may not be limited to the oxide composite semiconductor. The active layer 224 may be made of an oxide semiconductor such as MaMbMcOd(Ma, Mb, Mc: metal)

Also, the a-IGZO semiconductor may form the amorphous zinc oxide semiconductor layer using composite oxide targets, which contain gallium, indium and zinc in atomic ratios of 1:1:1, 2:2:1, 3:2:1, 4:2:1 and the like, respectively.

The oxide TFT according to the second exemplary embodiment may be allowed to adjust a carrier concentration of the active layer 224 by controlling a concentration of oxygen within reaction gas during sputtering for forming the amorphous zinc oxide semiconductor layer. Here, uniform device characteristics may be secured under a condition of 1 to 10% of oxygen concentration.

Figure 6C:
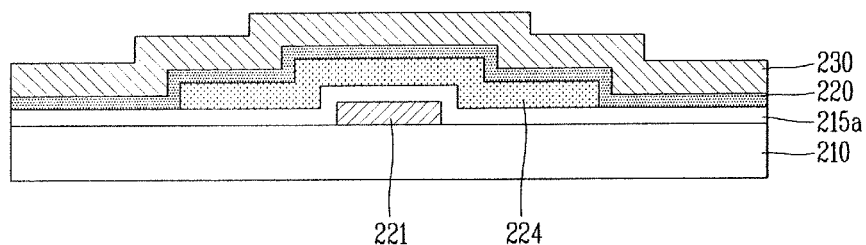

As shown in FIG. 6C, a second conductive film 220 and a third conductive film 230 may be formed on the entire surface of the substrate 210 having the active layer 224 thereon.

The second conductive film 220 may be made of titanium, which has selectivity with respect to upper second source and drain electrodes upon wet etching for forming lower first source and drain electrodes, and low contact resistance with respect to the amorphous zinc oxide semiconductor. The second conductive film 220 may also have a multilayered structure that at least one another conductive material is stacked on the titanium.

Here, the second conductive film 220 according to the first exemplary embodiment may have a thickness approximately in the range of 50 to 200 Å.

Also, since the third conductive film 230 forms the upper second source and drain electrodes, the third conductive film 230 may use a metal, such as copper (Cu), aurum (Au), molybdenum (Mo) and the like, each of which has a low resistivity irrespective of contact resistance with respect to the amorphous zinc oxide semiconductor.

Here, prior to depositing the second conductive film 220 on the substrate 210 having the active layer 224 formed thereon, a predetermined surface treatment, such as oxygen plasma treatment, may be carried out. This is to supply extra oxygen to a surface of the amorphous zinc oxide semiconductor because of strong oxidative property of the titanium when the titanium is selected as the second conductive film 220.

Figure 6D:
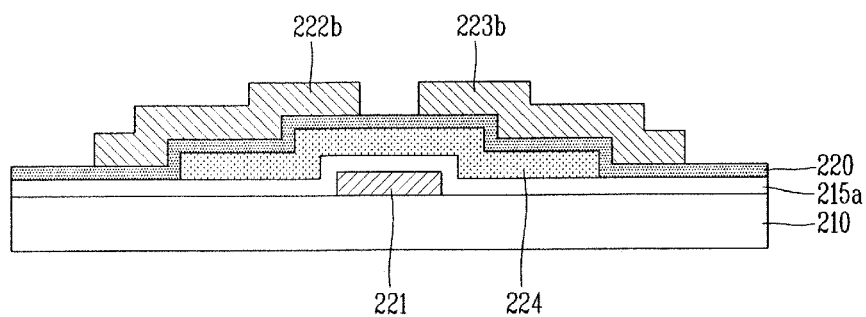

As shown in FIG. 6D, the third conductive layer 230 may be selectively patterned through a photolithography process (third masking process), thereby forming second source and drain electrodes 222b and 223b, which are formed of the third conductive film 230, on the second conductive film 220.

Here, etching of the third conductive film 230 may be wet etching which is appropriate for large scale and uniformity.

Figure 6E:
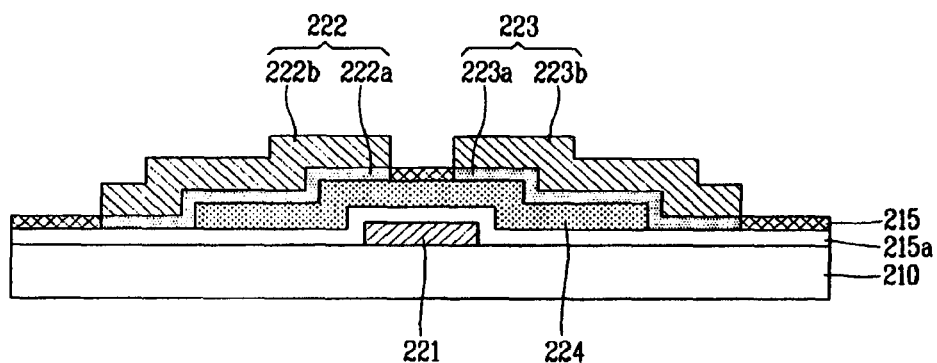

As shown in FIG. 6E, when titanium is employed as the second conductive film 220, the exposed second conductive film 220 may be oxidized into TiO through oxygen plasma treatment or a predetermined thermal treatment under oxygen-contained atmosphere after wet etching of the third conductive film 230, forming an in-situ protection layer 215 made of the TiO.

Here, the in-situ protection layer 215 located on the active layer 224 may protect a back channel of the active layer 224. The second conductive film 220 on which the second source and drain electrodes 222b and 223b are located may form the first source and drain electrodes 222a and 223a, separate from the in-situ protection layer 215.

As such, when the lower layer of the source and drain electrodes 222 and 223 is formed of the titanium, the titanium may be oxidized into the TiO to be used as the in-situ protection layer 215. This may result in simplification of processes and minimization of contact resistance.

That is, when the titanium is used as the second conductive film 220, a degree of the titanium being oxidized at room temperature may be ΔH=−940 KJ/mol, which is 2.5 times greater than a degree (~350 KJ/mol) of zinc being oxidized at room temperature. Therefore, the amorphous zinc oxide semiconductor may transit into a conductor on the source and drain regions of the active layer 224, which are brought into contact with the first source and drain electrodes 222a and 223a. This may minimize the contact resistance and thus improve a device performance.

Figure 6F:
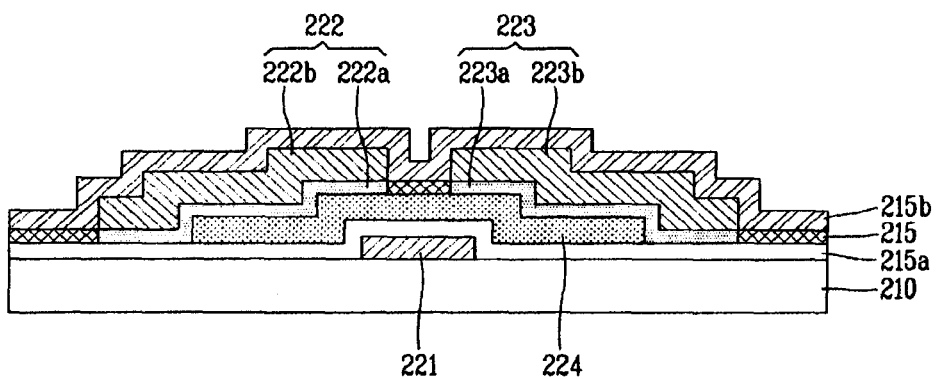

As shown in FIG. 6F, on the entire surface of the substrate 210 having the source and drain electrodes 222 and 223 thereon may be formed a lower passivation layer 215b for curing damage to a back channel of the active layer 224.

That is, as aforementioned, the lower passivation layer 215b may be formed of an insulating film, which contains oxygen (preferably, equal or larger than 1E+20 atoms/cm$^3$) and a small quantity of hydrogen (preferably, equal or smaller than 1E+20 atoms/cm$^3$), for curing the back channel region which suffers from the oxygen deficiency. As one example, the lower passivation layer 215b may be made of MOx (M: metal), such as TiOx, TaOx, AlOx and the like, or SiOx.

Here, to form a porous insulating layer, a deposition temperature may preferably be below 250° C. As one example, the lower passivation layer 215b may be deposited with a thickness of 10 Å to 100 Å at temperature of 100° C. to 250° C. After depositing the lower passivation layer 215b under the conditions, thermal treatment may further be carried out at temperature of 200° C. to 300° C.

Figure 6G:
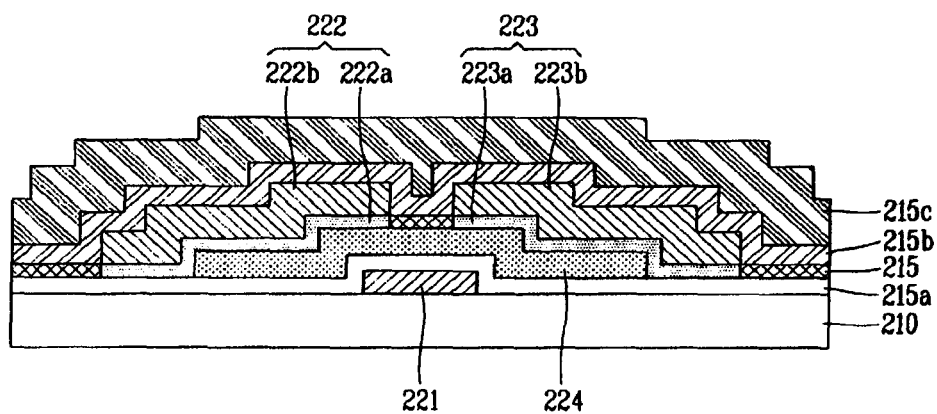

As shown in FIG. 6G, an upper passivation layer 215c may be formed on the entire surface of the substrate 210 having the lower passivation layer 215b thereon, so as to completely block the TFT from external environments.

Here, the upper passivation layer 215c may be formed of a high density film containing SiO$_2$.

Meanwhile, the dual-layered passivation structure may be applicable to a coplanar TFT as well as a bottom gate type TFT. This will be described in detail in accordance with a third exemplary embodiment of the present disclosure.

Figure 7:
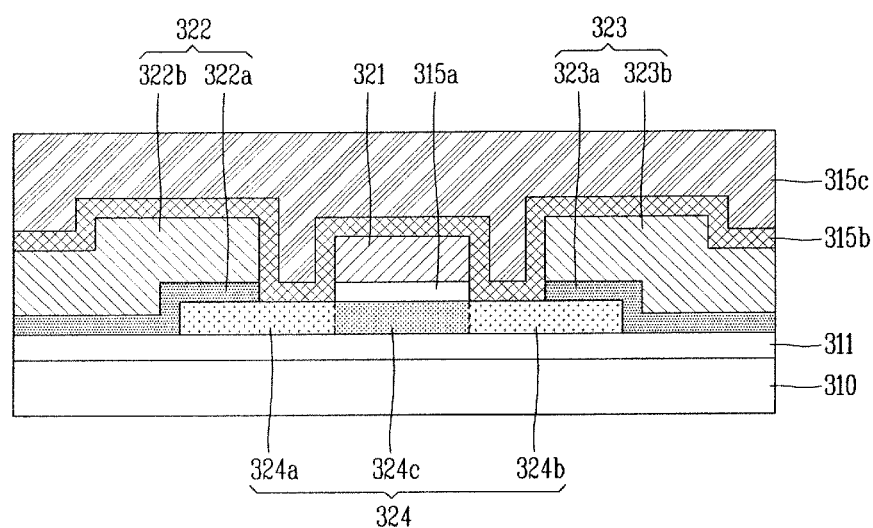
FIG. 7 is a sectional view schematically showing the structure of an oxide TFT according to a third exemplary embodiment of the present disclosure.

FIG. 7 is a sectional view schematically showing a structure of an oxide TFT according to a third exemplary embodiment of the present disclosure, which illustrates an oxide TFT having a self-aligned coplanar structure.

As shown in FIG. 7, the oxide TFT according to the third exemplary embodiment may include a buffer layer 311 on a predetermined substrate 310, an active layer 324 formed on the buffer layer 311 and made of amorphous zinc oxide semiconductor, a gate electrode 321 formed on the active layer 324 with interposing a gate insulating layer 311a therebetween, and source and drain electrodes 322 and 323 formed on the active layer 324 and electrically connected with predetermined regions, namely, source and drain regions 324a and 324b, of the active layer 324.

Here, the reference numeral 324c denotes a channel region, which is defined by the upper gate electrode 321 to form a conductive channel between the source region 324a and the drain region 324b.

Here, in the oxide TFT according to the third exemplary embodiment of the present disclosure, the active layer 324 may be formed by using amorphous zinc oxide (ZnO) semiconductor, as the same as the oxide TFTs according to the first and second exemplary embodiments, to satisfy high mobility and constant current test conditions and secure uniform characteristics, having an advantage of being applicable to a large-scale display.

In the oxide TFT according to the third exemplary embodiment of the present disclosure, the active layer 324 may be formed by using a-IGZO semiconductor obtained by containing heavy metals such as indium (In), gallium (Ga), or the like, in ZnO.

In the oxide TFT according to the third exemplary embodiment having the characteristics, a carrier concentration of the active layer 324 may be adjusted by controlling a concentration of oxygen within reaction gas during sputtering. This may allow for adjustment of device characteristics of the TFT. As one example, the active layer 324 may be formed using the a-IGZO semiconductor, which is deposited under a condition of 1 to 10% of oxygen concentration.

Since the oxide TFT according to the third exemplary embodiment may employ the coplanar structure that the gate electrode 321 and the source and drain electrode 322 and 323 are located on the active layer 324, damage to the channel region 324c of the active layer 324, which may be caused upon etching the source and drain electrodes 322 and 323, may be prevented so as to secure excellent device characteristics.

Here, the coplanar oxide TFT may have offset regions, defined as contact regions between the source and drain regions 324a and 324b of the active layer 324 and the source and drain electrodes 322 and 323 are spaced apart from the gate electrode 321 by predetermined distances. In this case, since the offset regions act as resistance regions with higher resistance than the contact region, unstable device characteristic may be exhibited.

The oxide TFT according to the third exemplary embodiment may employ the coplanar structure and over-etch the active layer 324 through dry etching during patterning of the gate electrode 321, to make the source and drain regions 324a and 324b, including the offset regions, conductive, thereby implementing stable device characteristics. Here, the present disclosure may not be limited to this. Making the corresponding regions conductive may be implemented by remaining (leaving) a partial portion of the gate insulating layer 315a and then removing the remaining (left) gate insulating layer 315a during patterning of the source and drain electrodes 322 and 323. This may have an advantage of preventing a risk that a region, which has been made conductive in response to the complete removal of the gate insulating layer 315a, is made conductive once again upon patterning the source and drain electrodes 322 and 323.

The oxide TFT according to the third exemplary embodiment may include the source and drain electrodes 322 and 323 having the double-layered structure so as to minimize contact resistance between the active layer 324 and the source and drain electrodes 322 and 323.

That is, the source and drain electrodes 322 and 323 according to the third exemplary embodiment, as the same as in the first and second exemplary embodiments, may include second source and drain electrodes 322b and 323b formed on an upper layer and made of a metal, such as copper (Cu), aurum (Au), molybdenum (Mo) or the like, each having low resistivity, irrespective of contact resistance with respect to the amorphous zinc oxide semiconductor, and first source and drain electrodes 322a and 323a formed on a lower layer coming in contact with the active layer 324 and made of a metal, such as titanium (Ti), titanium (Ti) alloy such as molybdenum titanium (MoTi), molybdenum (Mo) or the like, each having selectivity with respect to the second source and drain electrodes 322b and 323b during wet etching and low contact resistance with respect to the amorphous zinc oxide semiconductor.

To overcome or restore the defective regions, dual (two) passivation layers may be deposited. A lower passivation layer 315b may be deposited to overcome a deficiency and an upper passivation layer 315c may be deposited to minimize external affection.

Here, the back channel region of the coplanar type oxide TFT according to the third exemplary embodiment may be protected by the gate insulating layer 315a, but the lower passivation layer 315b, similar to the first and second exemplary embodiments, may be formed of an insulating film, which contains oxygen (preferably, equal or larger than 1E+20 atoms/cm$^3$) and a small quantity of hydrogen (preferably, equal or smaller than 1E+20 atoms/cm$^3$), for curing the back channel region. As one example, the lower passivation layer 315b may include MOx, such as TiOx, TaOx, AlOx or the like, or SiOx. Here, to form a porous insulating layer, a deposition temperature may preferably be below 250° C. For example, the lower passivation layer 315b may be deposited with a thickness of 10 Å to 100 Å at temperature of 100° C. to 250° C. After deposition of the lower passivation layer 315b under the conditions, thermal treatment may further be carried out at temperature of 200° C. to 300° C.

The upper passivation layer 315c may be a layer for completely blocking the TFT from external environments, and implemented as a high density layer containing SiO$_2$.

Hereinafter, description will be given in detail of a method for fabricating the oxide TFT according to the third exemplary embodiment having the configuration, with reference to the accompanying drawings.

FIGS. 8A to 8G are sectional views sequentially showing a fabrication process of the oxide TFT illustrated according to the third exemplary embodiment of the present disclosure in FIG. 7.

Figure 8A:
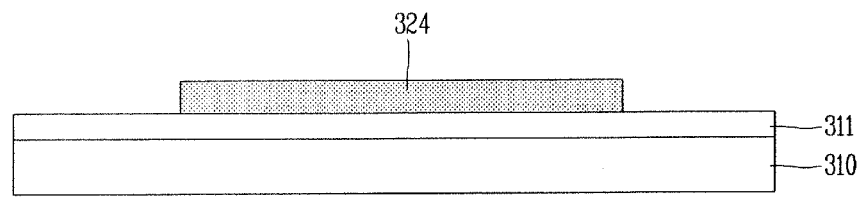
FIGS. 8A to 8G are sectional views sequentially showing a fabrication process of the oxide TFT illustrated according to the third exemplary embodiment of the present disclosure in FIG. 5.

As shown in FIG. 8A, a predetermined oxide semiconductor, for example, amorphous zinc oxide semiconductor may be deposited on a substrate 310 made of a transparent insulating material, and then selectively patterned through a photolithography process (a first masking process), to form an active layer 324, which is made of the oxide semiconductor, on the substrate 310.

Prior to depositing the oxide semiconductor on the substrate 310, a buffer layer 311 may be formed on the substrate 310.

Here, the buffer layer 311 may serve to prevent permeation of impurities, such as sodium, existing within the substrate 310 or the like, into an upper layer during a process like thermal treatment. In the present disclosure, since the active layer 324 is formed using the oxide semiconductor, the buffer layer 311 may also be removed.

In this case, oxide semiconductor applied to the oxide TFT may be deposited at a low temperature, so the substrate 110, such as a plastic substrate, soda-line glass, or the like, which may be applicable to a low temperature process, may be used. Also, since the oxide semiconductor exhibits amorphous characteristics, it may be used for the substrate 110 employed in a large-scale display device.

Here, the amorphous zinc oxide composite semiconductor, especially, the a-IGZO semiconductor may be formed by sputtering a composite target, such as gallium oxide (Ga$_2$O$_3$), indium oxide (In$_2$O$_3$) and zinc oxide (ZnO). In addition, a chemical deposition, such as the CVD or atomic layer deposition (ALD), may be available. Here, the present disclosure may not be limited to the oxide composite semiconductor. The active layer 324 may be made of an oxide semiconductor such as MaMbMcOd(Ma, Mb, Mc: metal).

Also, the a-IGZO semiconductor may form an amorphous zinc oxide semiconductor layer using composite oxide targets, which contain gallium, indium and zinc in atomic ratios of 1:1:1, 2:2:1, 3:2:1, 4:2:1 and the like, respectively.

The oxide TFT according to the third exemplary embodiment may be allowed to adjust a carrier concentration of the active layer 324 by controlling a concentration of oxygen within reaction gas during sputtering. Here, uniform device characteristics may be secured under a condition of 1 to 10% of oxygen concentration.

Figure 8B:
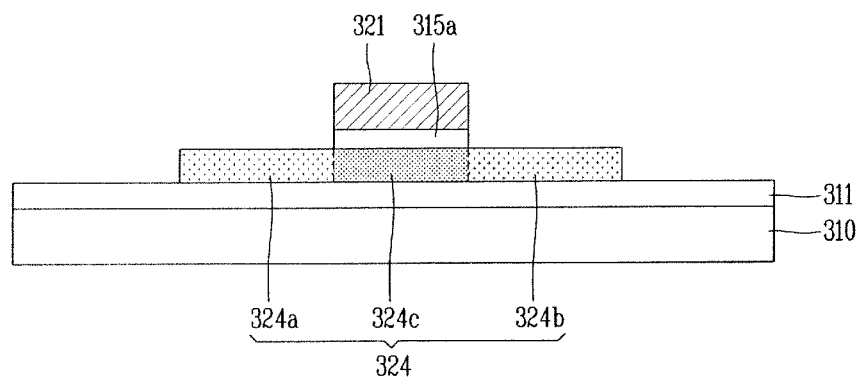

As shown in FIG. 8B, a predetermined insulating film and a first conductive film may be deposited on the substrate 310 with the active layer 324 formed thereon, and then selectively patterned through a photolithography process (a second masking process), to form a gate electrode 321, made of the first conductive film, on the active layer 324.

The gate electrode 321 may be formed on the active layer 324 with interposing therebetween a gate insulating layer 315a, made of the insulating film. Here, the active layer 324 and the gate electrode 321 may also be formed through one-time masking process by way of using a diffraction mask or a halftone mask.

Here, the insulating film may be an inorganic insulating film such as silicon oxide film, or the like, or a high dielectric oxide film such as hafnium (Hf) oxide or aluminum oxide, and dry etching such as oxygen plasma treatment may be employed. In addition, when the insulating film is formed of an oxide such as SiOx, HfOx or AlOx, surface treatment or thermal treatment may first be carried out prior to deposition of the insulating film.

Also, the first conductive film may be made of a low-resistivity obscure conductive material such as aluminum (Al), Al alloy, tungsten (W), copper (Cu), nickel (Ni), chromium (Cr), molybdenum (Mo), titanium (Ti), platinum (Pt), tantalum (Ta), and the like. Also, the first conductive film may be made of a transparent conductive material such as indium-tin-oxide (ITO), indium-zinc-oxide (IZO), or the like. Also, the first conductive film may have a multilayered structure by stacking two or more conductive materials.

Such dry etching may be carried out to over-etch an exposed region of the active layer 324, forming the source and drain regions 324a and 324b including offset regions.

That is, the active layer 324, which has been exposed when over-etching the insulating film through the oxygen plasma treatment for patterning the gate insulating layer 315a, may have a decreased resistance by the oxygen plasma. Accordingly, the source and drain regions 324a and 324b may be formed on the active layer 324. Here, the present disclosure may not be limited to this. The source and drain regions 324a and 324b may also be formed by changing the resistance of the active layer 324 exposed by the surface treatment or thermal treatment, such as the oxygen plasma, after patterning the gate insulating layer 315a. Also, the source and drain regions 324a and 324b may be made conductive by remaining a partial portion of the gate insulating layer 315a and then removing the remaining gate insulating layer 315a during patterning of the source and drain electrodes 322 and 323.

Here, the active layer 324 beneath the gate insulating layer 315a may define a channel region 324c which forms a conductive channel.

Figure 8C:
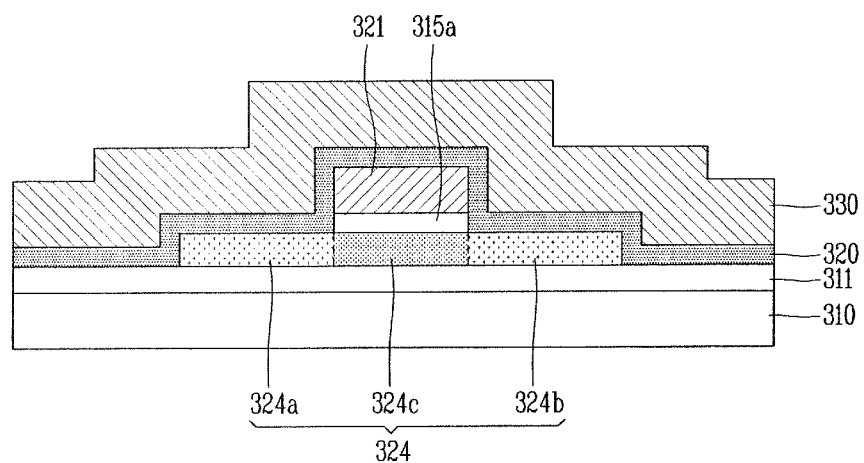

As shown in FIG. 8C, a second conductive film 320 and a third conductive film 330 may be formed sequentially on the entire surface with the active layer 324 formed thereon.

The second conductive film 320 may use a metal, such as titanium, titanium alloy such as molybdenum titanium, molybdenum or the like, which has selectivity with respect to the upper second source and drain electrodes upon wet etching for forming the first source and drain electrodes of the lower layer, and low contact resistance with respect to the amorphous zinc oxide semiconductor. The second conductive film 320 may have a multilayered structure that at least one another conductive material is stacked on a metal, such as the titanium, molybdenum titanium, molybdenum or the like.

Here, the second conductive film 320 according to the third exemplary embodiment may have a thickness approximately in the range of 50 to 200 Å, while having a thickness approximately in the range of 50 to 300 Å upon using dry etching. Accordingly, the damage to the oxide semiconductor due to the dry etching may be minimized.

Also, since the third conductive film 330 forms the upper second source and drain electrodes, the third conductive film 330 may be made of a metal, such as copper (Cu), aurum (Au), molybdenum (Mo) and the like, each of which has a low resistivity, irrespective of contact resistance with the amorphous zinc oxide semiconductor.

Here, prior to depositing the second conductive film 320 on the substrate 310 having the active layer 324 formed thereon, a predetermined surface treatment, such as oxygen plasma treatment, may be carried out. This is to supply extra oxygen to a surface of the amorphous zinc oxide semiconductor because of strong oxidative property of the titanium when the titanium is selected as the second conductive film 320.

Figure 8D:
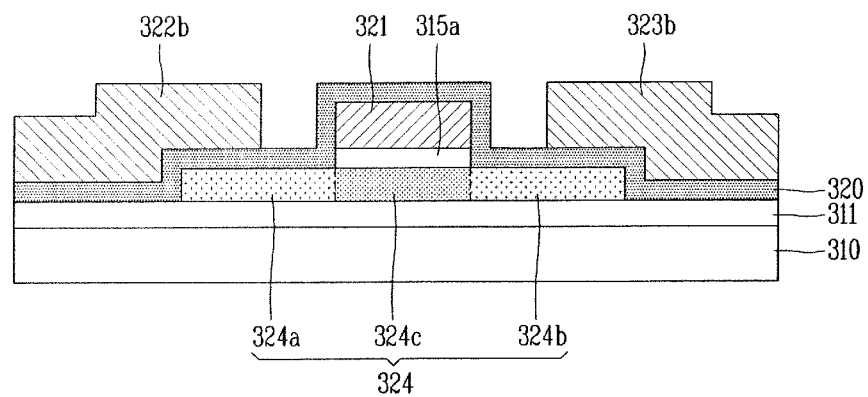

As shown in FIG. 8D, the third conductive layer 330 may be selectively patterned through a photolithography process (a third masking process), thereby forming second source and drain electrodes 322b and 323b, which are formed of the third conductive film 330, on the second conductive film 320.

Here, etching of the third conductive film 330 may be wet etching which is appropriate for large scale and uniformity.

By selectively patterning the lower second conductive film 320, the first source and drain electrodes 322a and 323a, which are formed of the second conductive film 320, may be formed. Here, etching of the second conductive film 320 may be dry etching. As aforementioned, since the second conductive film 320 is formed thin approximately in the range of 50 to 300 Å, damage to the oxide semiconductor due to the dry etching may be minimized.

Figure 8E:
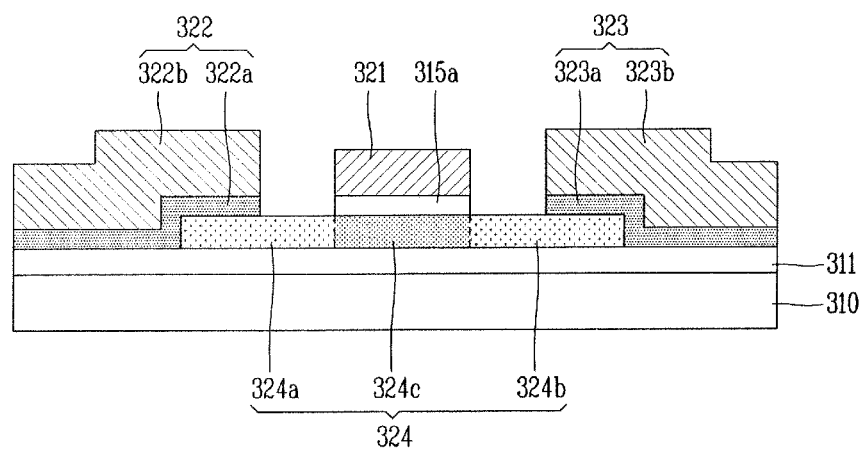
Figure 8F:
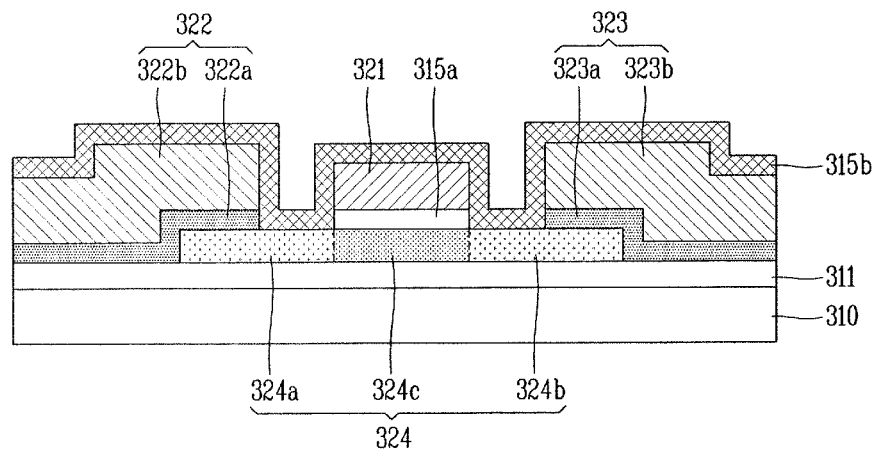

As shown in FIG. 8F, a lower passivation layer 315b may be formed on the entire surface of the substrate 310 with the source and drain electrodes 322 and 323 formed thereon.

That is, the lower passivation layer 315b may be made of an insulating film containing oxygen and a small quantity of hydrogen. As one example, the lower passivation layer 315b may be made of MOx (M: metal), such as TiOx, TaOx, AlOx and the like, or SiOx.

Here, to form a porous insulating layer, a deposition temperature may preferably be below 250° C. For example, the lower passivation layer 315b may be deposited with a thickness of 10 Å to 100 Å at temperature of 100° C. to 250° C. After deposition of the lower passivation layer 315b under the conditions, thermal treatment may further be carried out at temperature of 200° C. to 300° C.

Alternatively, when titanium is employed as the second conductive film 320, the exposed second conductive film 320 may be oxidized into TiO through oxygen plasma treatment or a predetermined thermal treatment under oxygen-contained atmosphere after wet etching of the third conductive film 330, forming an in-situ protection layer 315 made of the TiO, as illustrated in FIGS. 8E' to 8G'.

Figure 8G:
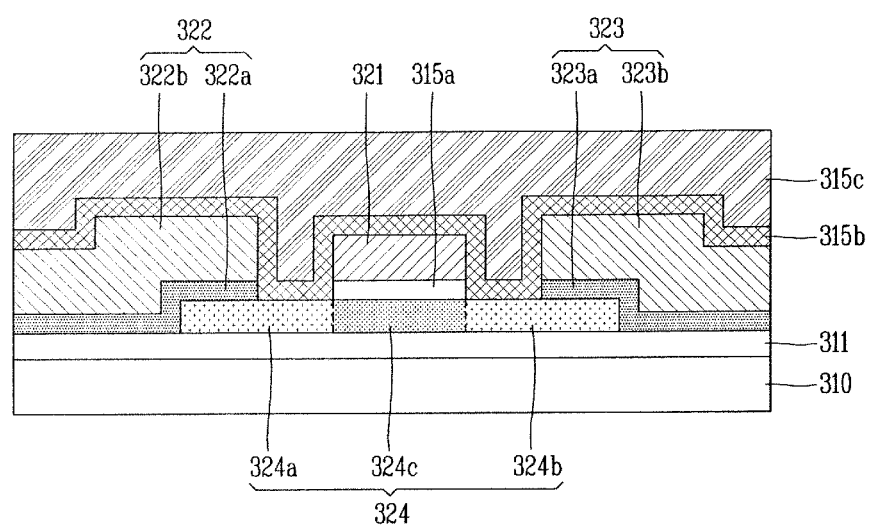
Figure 8E:
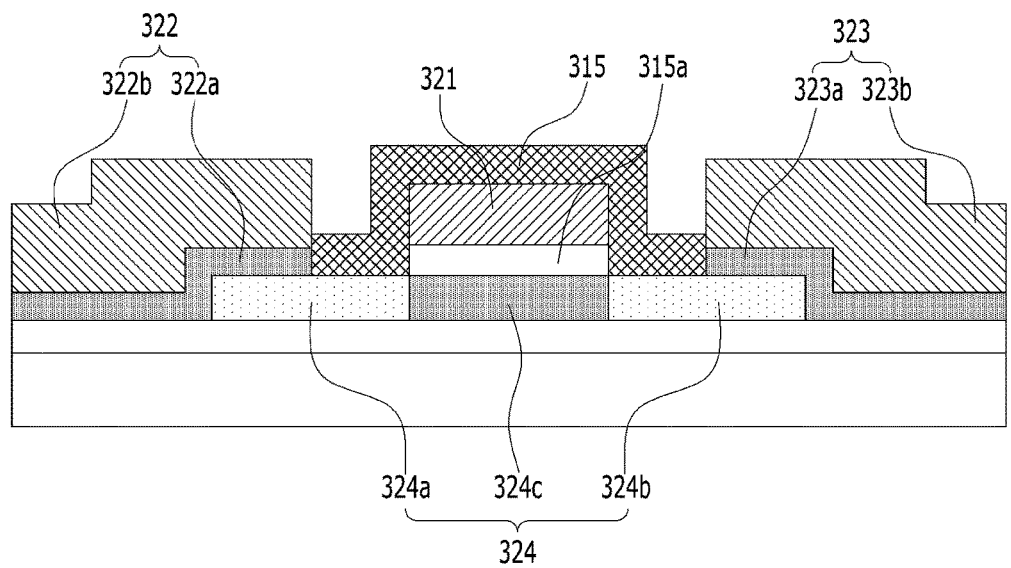
Figure 8F:
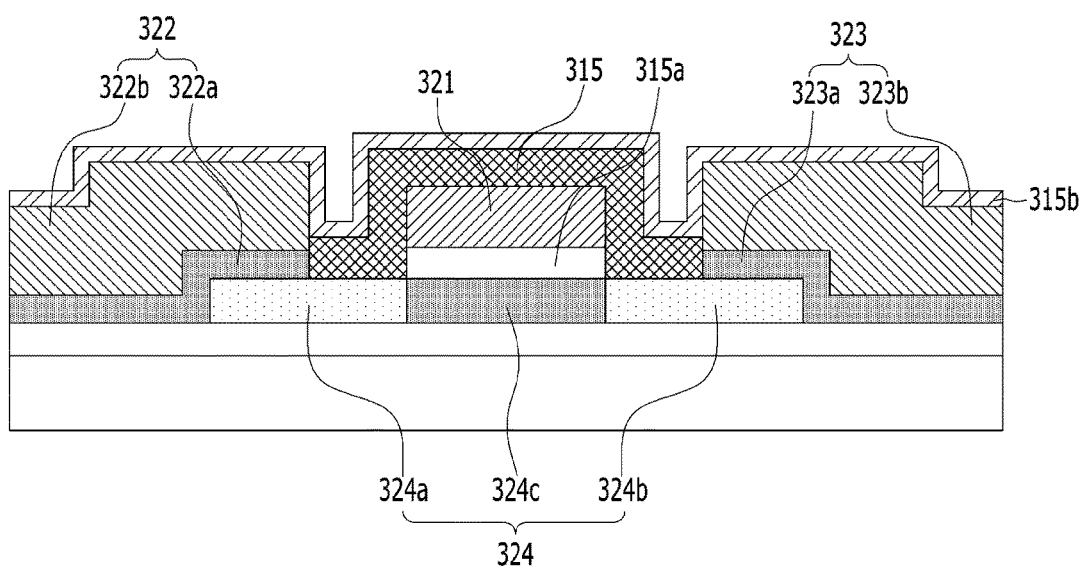
Figure 8G:
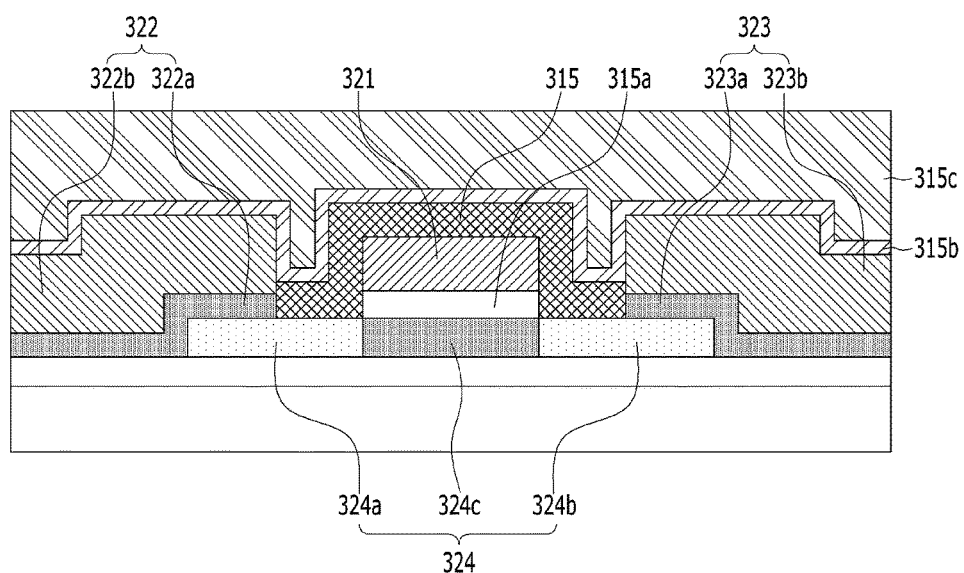

As shown in FIG. 8G, an upper passivation layer 315c may be formed on the entire surface of the substrate 310 having the lower passivation layer 315b thereon, so as to completely block the TFT from external environments.

Here, the upper passivation layer 315c may be formed of a high density film containing $SiO_2$.

As described above, the present disclosure may be applicable to other display devices, which are fabricated using TFTs, in addition to the LCD device. For example, the present disclosure may be applied even to an OLED display device connected with OLEDs.

Also, the present disclosure may have advantages of being used for transparent electronic circuits or flexible displays, owing to employing an amorphous zinc oxide semiconductor material, which has high mobility and can be processed by a low temperature process.

As the present disclosure may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A thin film transistor, comprising:
   an active layer of an oxide semiconductor;
   source and drain electrodes on the active layer, wherein the source and drain electrodes comprise first source and drain electrodes of a second conductive film on the active layer, and second source and drain electrodes of a third conductive film on the first source and drain electrodes;
   a gate insulating layer on the active layer between the source and drain electrodes;
   a gate electrode of a first conductive film on the gate insulating layer;
   an in-situ protection layer of an oxide of the second conductive film on the active layer and the gate electrode; and
   a passivation layer on the in-situ protection layer, the passivation layer directly contacting the third conductive film and the in-situ protection layer that are located over the active layer of the oxide semiconductor.

2. The thin film transistor of claim 1, wherein the second conductive film has a low contact resistance with respect to the oxide semiconductor, and wherein the third conductive film has a low resistivity, irrespective of contact resistance with respect to the oxide semiconductor.

3. The thin film transistor of claim 1, wherein the first source and drain electrodes comprise at least one of Ti, Ti alloy, Mo and Mo alloy, the second source and drain electrodes comprise at least one of Cu, Ag and Mo.

4. The thin film transistor of claim 1, wherein the passivation layer comprises at least one of TiOx, Ta Ox, AlOx and SiOx.

5. The thin film transistor of claim 1, wherein the oxide semiconductor is an amorphous zinc-based oxide semiconductor.

6. The thin film transistor of claim 1, wherein the second conductive film has a thickness in a range of 50 Å to 300 Å.

7. The thin film transistor of claim 1, wherein the passivation layer has a higher density than the in-situ protection layer.

8. A thin film transistor, comprising:
an active layer of an oxide semiconductor;
source and drain electrodes on the active layer, wherein the source and drain electrodes comprise first source and drain electrodes of a second conductive film on the active layer, and second source and drain electrodes of a third conductive film on the first source and drain electrodes;
a gate insulating layer on the active layer between the source and drain electrodes;
a gate electrode of a first conductive film on the gate insulating layer;
an in-situ protection layer of an oxide of the second conductive film on the active layer and the gate electrode;
a lower passivation layer on the in-situ protection layer, the lower passivation layer directly contacting the third conductive film and the in-situ protection layer that are located over the active layer of the oxide semiconductor; and
an upper passivation layer on the lower passivation layer.

* * * * *